United States Patent
Watanabe

(10) Patent No.: US 9,419,643 B2
(45) Date of Patent: Aug. 16, 2016

(54) DELTA SIGMA MODULATOR

(71) Applicant: TOYOTA JIDOSHA KABUSHIKI KAISHA, Toyota-shi, Aichi-ken (JP)

(72) Inventor: Hikaru Watanabe, Nagoya (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 0 days.

(21) Appl. No.: 14/943,401

(22) Filed: Nov. 17, 2015

(65) Prior Publication Data

US 2016/0149585 A1 May 26, 2016

(30) Foreign Application Priority Data

Nov. 26, 2014 (JP) ................................. 2014-239037

(51) Int. Cl.
*H03M 3/00* (2006.01)

(52) U.S. Cl.
CPC .............. *H03M 3/364* (2013.01); *H03M 3/464* (2013.01); *H03M 3/472* (2013.01)

(58) Field of Classification Search
CPC ..... H03M 3/364; H03M 3/464; H03M 3/472; H03M 3/412; H03M 7/3028; H03M 3/424
USPC ................................................ 341/143, 155
See application file for complete search history.

(56) References Cited

U.S. PATENT DOCUMENTS

| | | | | |
|---|---|---|---|---|
| 6,313,774 B1 * | 11/2001 | Zarubinsky | ........... | H03M 3/412 341/143 |
| 6,404,368 B1 * | 6/2002 | Yamaguchi | ........... | H03M 3/412 341/143 |
| 7,564,389 B1 * | 7/2009 | Byrd | ....................... | H03M 3/39 341/143 |
| 8,248,285 B2 * | 8/2012 | Van Veldhoven | ..... | H03M 3/428 341/143 |
| 2015/0102951 A1 | 4/2015 | Watanabe | | |

FOREIGN PATENT DOCUMENTS

JP  2007-243620 A  9/2007
WO  2013/157127 A1  10/2013

OTHER PUBLICATIONS

Chen, et al., "A 1.5V 1mA 80dB Passive ΣΔ ADC in 0.13μm Digital CMOS Process", ISSCC 2003, 10 pages.
Boser, et al., "The Design of Sigma-Delta Modulation Analog-to-Digital Converters", IEEE Journal of Solid State Circuits, vol. 23, No. 6, Dec. 1988, 12 pages.

* cited by examiner

*Primary Examiner* — Khai M Nguyen
(74) *Attorney, Agent, or Firm* — Kenyon & Kenyon LLP

(57) ABSTRACT

A ΔΣ modulator converts an input analog quantity into a digital value quantized with a predetermined number of bits and outputs the digital value. The ΔΣ modulator includes an integrator that includes a capacitor and integrates a difference between the input analog quantity and an analog quantity acquired from D/A conversion of the output digital value by a D/A converter; a quantizer that quantizes an analog quantity acquired from integration by the integrator; and a digital integrator that carries out an integration operation on data acquired from quantization by the quantizer.

20 Claims, 7 Drawing Sheets

DELTA SIGMA MODULATOR

CROSS-REFERENCE TO RELATED APPLICATION

The present application claims priority to Japanese Patent Application No. 2014-239037 filed on Nov. 26, 2014, which is incorporated herein by reference in its entirety.

BACKGROUND OF THE INVENTION

1. Field of the Invention
The present invention relates to a ΔΣ modulator.
2. Description of the Related Art
In the related art, a ΔΣ modulator applied to an A/D converter or so is known. The ΔΣ modulator converts an input analog quantity into a digital value and outputs it (for example, see Non-Patent Reference No. 1, i.e., "Feng Chen, Srinath Ramaswamy, Bertan Bakkaloglu, "A 1.5V 1 mA 80 dB Passive ΔΣ ADC in 0.13 μm Digital CMOS Process", ISSCC 2003"). Generally speaking, in order to acquire high resolution in an A/D converter, a ΔΣ modulator of a second order or more, i.e., a ΔΣ modulator having two or more stages of integrators connected in a cascade manner, is used. As an integrator in a ΔΣ modulator, there is an integrator using a capacitor without using an operational amplifier (hereinafter, referred to as a "passive integrator") other than an integrator that is an analog circuit including an amplifier circuit such as an operational amplifier (hereinafter, referred to as an "active integrator"). A ΔΣ modulator shown in the above-mentioned Non-Patent Reference No. 1 includes a plurality of passive integrators connected in a cascade manner.

SUMMARY OF THE INVENTION

According to an aspect of the present invention, a ΔΣ modulator converts an input analog quantity into a digital value quantized with a predetermined number of bits and outputs the digital value. The ΔΣ modulator includes an integrator that includes a capacitor and integrates a difference between the input analog quantity and an analog quantity acquired from D/A conversion of the output digital value by a D/A converter; a quantizer that quantizes an analog quantity acquired from integration by the integrator; and a digital integrator that carries out an integration operation on data acquired from quantization by the quantizer.

Other objects, features and advantages of the present invention will become more apparent from the following detailed description when read in conjunction with the accompanying drawings.

DETAILED DESCRIPTION OF THE EMBODIMENT

The above-mentioned passive integrator is different from the above-mentioned active integrator in that there are no restrictions concerning the slew rate and the feedback oscillation stability of the operational amplifier, and a settling operation can be carried out with time constants determined by switch resistance(s) and capacitance(s). Therefore, in a ΔΣ modulator having such a passive integrator, it is possible to allow the integrator to operate at a high operational frequency exceeding the operational frequency limit of an operational amplifier by making such a design as to sufficiently reduce the switch resistances of the passive integrator.

However, in a passive integrator, the output changes when a charge is taken out from an integration capacitor for the subsequent stage because a charge leak occurs at this time. Therefore, an error corresponding to the changed amount is generated in the conversion characteristics. In order to suppress the error, it is necessary to reduce the charge that is allowed to be taken out as the output from the passive integrator to be so small as to be ignorable in comparison to the charge stored in the capacitor. As a result, in such a configuration that a plurality of passive integrators are connected in a cascade manner as mentioned above, the more subsequent stage the passive integrator is, the smaller the charge allowed to be taken out as the output from the passive integrator becomes.

Further, in order to control the integrator leak from the passive integrator to be small, it is necessary to sufficiently reduce the output voltage amplitude in comparison to the input voltage amplitude. Therefore, in such a configuration that a plurality of the passive integrators are connected in a cascade manner as mentioned above, the more subsequent stage the passive integrator is, the smaller the signal amplitude of the passive integrator becomes. As a result, the output signal amplitude of the integrator in the last stage is remarkably small, and the input signal amplitude of the quantizer to which the output signal of the integrator in the last stage is input is very small. Therefore, in such a configuration that the order of a ΔΣ modulator is increased by employing a multiple stages of passive integrators, there is a limit for ensuring high resolution.

The present embodiment of the present invention has been devised in consideration thereof, and an object of the present embodiment is to provide a ΔΣ modulator whereby it is possible to suppress an error due to a charge leak from an integrator and acquire high resolution while ensuring a high operational frequency.

Below, using the drawings, the specific embodiment of a ΔΣ modulator according to the present invention will be described.

Figure 1:
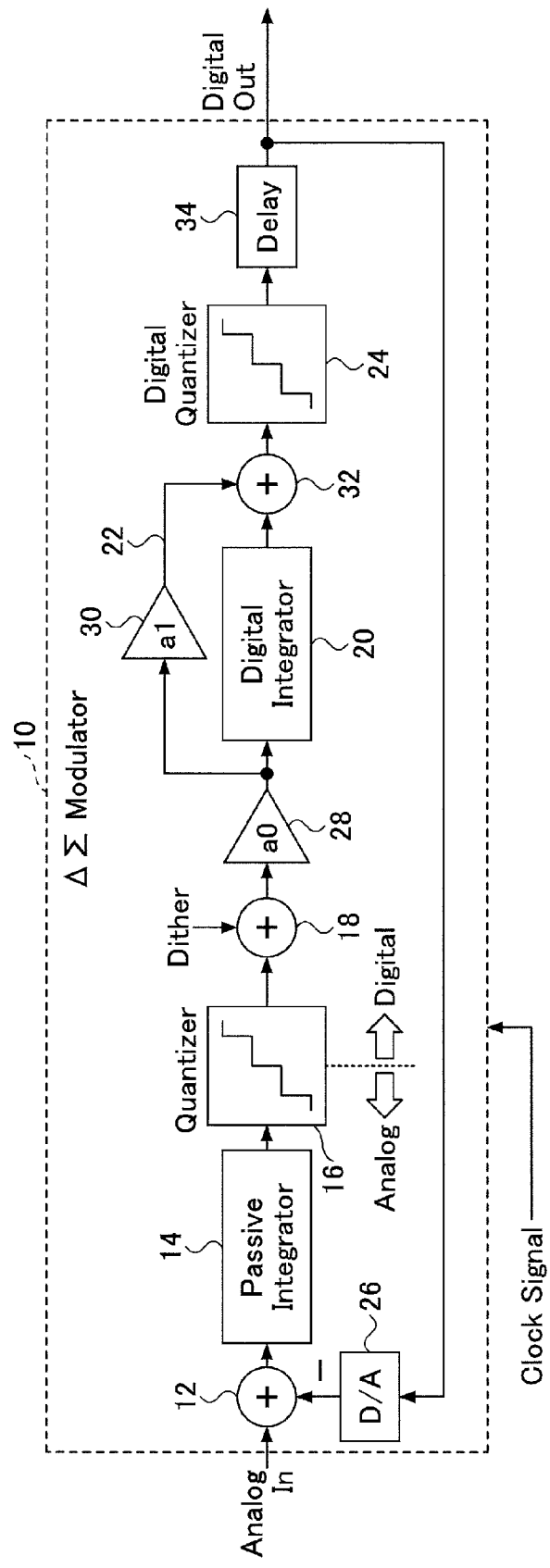
FIG. 1 shows a configuration diagram of a ΔΣ modulator according to one embodiment of the present invention.

FIG. 1 shows a configuration diagram of the ΔΣ modulator according to the present embodiment of the present invention. The ΔΣ modulator 10 according to the present embodiment is a modulator applicable to an A/D converter of a ΔΣ type that is an analog-to-digital converter converting an input analog quantity into a digital value. An A/D converter of a ΔΣ type is an A/D converter usable for sensor detection, motor/solenoid current detection, load short-circuit/open-circuit detection, or so, used for on-board electronic control, for example, and is an A/D conversion system where it is possible to achieve high resolution.

In the present embodiment, the ΔΣ modulator 10 converts an input analog quantity into a digital signal sequence (a digital value) quantized by a predetermined number of bits. The ΔΣ modulator 10 includes a differential signal generator 12, an integrator 14, a quantizer 16, an adder 18, an integrator 20, a bypass path 22, a digital quantizer 24 and a D/A converter 26. The ΔΣ modulator 10 is a ΔΣ modulator of a high order (greater than or equal to a second order) where the integrator 14 and the integrator 20 are included in a mixed manner, more specifically, the integrator 14 and the integrator 20 are connected in a cascade manner as integrators.

An analog quantity is input to the differential signal generator 12 from the outside, and an analog quantity that is output from the D/A converter 26, described later, is also input to the differential signal generator 12. The differential signal generator 12 generates a differential signal indicating the difference between the analog quantity that is input from the outside and the analog quantity that is input from the D/A converter 26 (more specifically, the difference acquired from subtracting the analog quantity that is input from the D/A converter 26 from the analog quantity that is input from the outside).

The integrator 14 is connected to the differential signal generator 12. The differential signal generated by the differential signal generator 12 is input to the integrator 14. The integrator 14 is an analog integrator that outputs the analog value acquired from adding and integrating the differential signal from the differential signal generator 12. The integrator 14 employs a capacitor and a switch, without using an operational amplifier as an amplifier circuit, and carries out an integration operation by storing charge in the integration capacitor. Hereinafter, the integrator 14 will be referred to as a "passive integrator 14". Note that the ΔΣ modulator 10 includes only a single stage of the passive integrator 14.

The quantizer 16 is connected to the passive integrator 14. The value (an analog quantity) acquired from integration by the passive integrator 14 is input to the quantizer 16. The quantizer 16 is an analog-value-input/digital-value-output quantizer outputting a digital numerical value by carrying out quantization of converting the analog quantity from the passive integrator 14 to a stepwise value by using a plurality of thresholds.

The quantizer 16 is a multi-bit quantizer having a plurality of comparators having different thresholds, respectively, placed in parallel. The respective comparators in the quantizer 16 determine whether the input analog amount is greater than the predetermined thresholds to output digital high/low levels (for example, 5V/0V when the power supply voltage is 5V) through amplification and shaping of the waveform. The quantizer 16 outputs the digital value (a digital signal sequence) acquired from quantizing the analog quantity from the passive integrator 14 by a predetermined number of bits such as one or more bits (for example, 4 bits).

The adder 18 is connected to the quantizer 16. The digital value that is output by the quantizer 16 is input to the adder 18. The adder 18 is an operation unit that adds the digital value from the quantizer 16 and a predetermined dither signal "Dither". The dither signal "Dither" is a signal having a periodically repeated digital value of binary or more and having an amplitude greater than or equal to ½ the quantization step width of the quantizer 16. The dither signal "Dither" is generated by a dither generation circuit such as a circuit generating a square wave periodically. The adder 18 functions as an application circuit that applies the dither signal "Dither" from the dither generation circuit to the digital value from the quantizer 16.

The integrator 20 is connected to the adder 18 via a multiplier 28. The digital value calculated by the adder 18 is input to the integrator 20 after the multiplier 28 multiplies a proportionality factor a0. The integrator 20 is a digital integrator that adds and integrates the digital value from the adder 18 and outputs the thus acquired value. Hereinafter, the integrator 20 will be referred to as a "digital integrator 20". The digital integrator 20 includes an adder and a flip-flop circuit that are digital circuits, and carries out a digital process of an integration operation on the digital numerical data from the adder 18. Note that in the ΔΣ modulator 10, the digital integrator 20 can include a plurality of the digital integrators 20 connected in a cascade manner.

On the signal path from the input side through the output side of the ΔΣ modulator 10, the bypass path 22 which bypasses the digital integrator 20 is connected. The bypass path 22 is a feedforward path connecting the input terminal side and the output terminal side of the digital integrator 20. On the bypass path 22, a multiplier 30 is installed. The multiplier 30 multiplies the digital value that is input to the digital integrator 20 by a proportionality factor a1, and outputs the thus acquired value to the output terminal side of the digital integrator 20. The value (a digital value) acquired from integration by the digital integrator 20 is added to the digital value from the bypass path 22 by the adder 32.

The digital quantizer 24 is connected to the digital integrator 20 (more specifically, to the adder 32). The digital value acquired from the integration by the digital integrator 20 (more specifically, the digital value acquired from adding the digital value acquired from the integration by the digital integrator 20 and the digital value from the bypass path 22) is input to the digital quantizer 24. The digital quantizer 24 is a digital-value-input/digital-value-output quantizer carrying out, as a digital signal process, quantization of converting the digital value from the side of the digital integrator 20 into a coarser stepwise value by using a plurality of thresholds, and outputting a digital numerical value. The digital quantizer 24 outputs the digital value (a digital signal sequence) acquired from quantization of the digital value from the side of the digital integrator 20 by a predetermined number of bits such as one or more bits (for example, 14 bits) as the output of the ΔΣ modulator 10.

The D/A converter 26 is connected to the digital quantizer 24, and also, a digital filter constituting a ΔΣ A/D converter is connected to the digital quantizer 24. The digital value that is output by the digital quantizer 24 is input to the D/A converter 26 and the digital filter. Note that it is possible that, as shown in FIG. 1, a delay circuit 34 is installed on the output side of the digital quantizer 24. The delay circuit 34 outputs the digital value that is output after being quantized by the digital quantizer 24 to the D/A converter 26 and the digital filter after delaying a predetermined period of time.

The D/A converter 26 converts the digital value from the digital quantizer 24 into an analog quantity. The analog quantity acquired through the conversion and output by the D/A converter 26 is input to the differential signal generator 12 as a feedback signal. The differential signal generator 12 subtracts the analog quantity from the D/A converter 26 from the analog quantity that is input to the ΔΣ modulator 10 and generates a differential signal indicating the difference therebetween.

The above-mentioned digital filter removes quantization error components by carrying out filtering such as a moving average filter process on the digital value from the digital quantizer 24 and outputs final digital data. The output of the digital filter functions as a digital output acquired after the A/D conversion through the ΔΣ A/D converter.

Note that the respective elements carrying out the digital processes in the ΔΣ modulator 10 unitarily operate as the single ΔΣ modulator 10. In other words, the quantizer 16, the digital integrator 20, the digital quantizer 24 and the D/A converter 26 operate in synchronization by the same clock signal.

The ΔΣ modulator 10 configured as described above is a high-order ΔΣ modulator including the plurality of integrators connected in the cascade manner, and includes the passive integrator 14 employing a capacitor and a switch without using an operational amplifier and the digital integrator 20 carrying out the integration process in the digital operation. The ΔΣ modulator 10 samples and integrates an input analog quantity by using the passive integrator 14, thereafter converting the thus acquired value into a digital value by using the quantizer 16, then carrying out the integration operation by the digital process through the digital integrator 20, and outputting a digital value through the digital quantizer 24.

In the ΔΣ modulator 10, as an integrator, the passive integrator 14 employing a capacitor is used without using an operational amplifier. Therefore, according to the configuration of the present embodiment, different from a configuration employing an integrator (i.e., an active integrator) using an operational amplifier as an integrator, there are no restrictions concerning the slew rate and/or the oscillation stability of feedback of the operational amplifier. Therefore, it is possible to allow the integrator to operate at a high operational frequency exceeding the operational frequency limit of the operational amplifier by making such a design as to sufficiently reduce the switch resistance of the passive integrator. Also, according to the configuration of the present embodiment, because the passive integrator 14 does not employ an operational amplifier, it is possible to achieve miniaturization and reduction in the power consumption of the integrator.

Further, in the ΔΣ modulator 10, the digital integrator 20 is installed as an integrator in the subsequent stage of the passive integrator 14. The digital integrator 20 carries out the integration operation in the digital process and processes the signal that is the digital data acquired through the conversion. Therefore, it is possible to implement ideal integrator characteristics excluding the error factors such as the integrator leak, noise, and so forth, by ensuring a sufficient operational bit length in design. Therefore, even in the configuration of the present embodiment where the digital integrator 20 is connected to the passive integrator 14 in the cascade manner, an error due to a leak of the output charge from each integrator is not likely to occur in comparison to a configuration where a plurality of passive integrators are connected in a cascade manner. Therefore, a situation where the voltage amplitude is reduced every integration operation and a situation where a noise is added and the signal-to-noise ratio (SNR) is degraded are suppressed.

Therefore, in the ΔΣ modulator 10 according to the present embodiment, it is possible to acquire the high resolution by suppressing an error due to a charge leakage in the integrator while ensuring a high operational frequency.

In a configuration where a plurality of passive integrators are connected in a cascade manner, the more subsequent stage the passive integrator is, the smaller the output signal amplitude becomes. In a quantizer subsequent to the passive integrator, the smaller the input signal amplitude is, the longer period of time is required for carrying out comparison and amplification operations through a comparator in the quantizer. Therefore, when the input signal amplitude of the quantizer is very small, the comparator in the quantizer is not allowed to operate at high speed. As a result, when the required operational frequency is high, it may be impossible for the quantizer to complete the comparison and amplification operations within a given period of time. Therefore, such an erroneous phenomenon ("metastability") where a high level and a low level of the digital output are not determined may occur. In other words, when the input signal amplitude of the quantizer is very small, the quantizer is not allowed to operate at high speed. Due to such a restriction in the operational speed of the quantizer, a whole ΔΣ modulator circuit is not allowed to operate at high speed.

As a method of avoiding metastability while ensuring high resolution, one or a plurality of stages of amplifiers (preamplifiers) may be placed in a preceding stage of the quantizer so that the comparison operation can be carried out after the input signal to the comparator in the quantizer is thus amplified. When the preamplifiers have open-loop configurations of relatively low gains (i.e., several through tens), they have no restrictions concerning the oscillation stability different from an operational amplifier having a closed-loop and feedback configuration. Therefore, it is possible to implement a high-speed operation. Also, the preamplifiers are advantageous when suppressing such a phenomenon (i.e., so-called "kickback") that steep variations of the output of the quantizer between the high and low levels are returned as a pulse-like noise to the input side of the quantizer, i.e., the output side of the integrator. Further, in order to amplify the signal having the very small amplitude to such an amplitude as to allow the quantizer to determine the high level and the low level, the preamplifier may be required to have a high gain. In order to further increase the gain, a plurality of the preamplifiers connected in a cascade manner may be required.

However, generally speaking, a preamplifier having a high gain has a greater circuit time constant and has a lower operational speed. Also, when preamplifiers are connected in a cascade manner, the operational speed is further reduced. Therefore, from a viewpoint of the operational speed, the method may be disadvantageous. That is, in the method of using the preamplifier(s), it is advantageous to improve the resolution to some extent. However, there is a limit for increasing the operational speed of the quantizer. Also, when the number of stages of the preamplifiers having high gains is increased, the chip area and the power consumption are increased accordingly.

In contrast thereto, in the ΔΣ modulator 10 according to the present embodiment, the input signal amplitude of the quantizer 16 is great because the analog quantity that is output by the passive integrator that is the integrator in the first stage is input to the quantizer 16 in comparison to a case where an analog quantity that is output from the integrator in the last stage of a plurality of passive integrators is input to a quantizer. Therefore, according to the present embodiment, it is possible to carry out comparison and amplification operations at a higher speed with higher resolution, it is possible to more effectively suppress the above-mentioned metastability, and thereby, it is possible to implement a higher speed and more stable quantizer operation in comparison to a configuration where a plurality of passive integrators are connected in a cascade manner. Also, according to the present embodiment, because the input signal amplitude of the quantizer 16 is thus great, it is possible to set the gain of the preamplifier(s) to be relatively lower, remove the preamplifier(s) or reduce the number of stages of the preamplifiers. Thereby, it is possible to increase the operational speed of the quantizer circuit part including the preamplifier(s), and also, it is possible to suppress the increase in the chip area and the increase in the power consumption due to the preamplifier(s).

Further, the digital integrator 20 installed in the subsequent stage of the quantizer 16 is made of a simple circuit including an adder and a flip-flop circuit that are digital circuits as mentioned above. Therefore, the digital integrator 20 is allowed to operate at a higher speed in comparison to the passive integrator and the quantizer that are the analog circuits. Also, the digital quantizer 24 installed in the subsequent stage of the digital integrator 20 is made of a simple circuit including a digital circuit for rounding-up or rounding-down a lower bit. Therefore, the digital quantizer 24 is allowed to operate at high speed. Accordingly, in the ΔΣ modulator 10 according to the present embodiment, it is possible to allow the whole modulator circuit to operate at a remarkably higher speed in comparison to a ΔΣ modulator employing an active integrator using an operational amplifier or a ΔΣ modulator having many stages of passive integrators.

In a ΔΣ modulator, it is advantageous to employ a multi-bit quantizer inside the circuit and a multi-bit D/A converter for feedback instead of single-bit ones because the quantization noise is reduced and the resolution is increased. However, if many stages of passive integrators are used and therefore the input signal amplitude in the quantizer becomes very small (for example, on the order of 100 μV), it is very difficult to acquire multi-bit digital data from such an input signal directly through a multi-bit quantizer.

For example, a case will now be assumed where, as a quantizer, a parallel-type A/D converter is used, and also, the respective comparators that are elements of the quantizer are made of CMOS circuits. In this case, the input offset of each comparator may have a variation of ±several millivolts. Therefore, it is not possible to acquire the accuracy greater than or equal to the several millivolts. By placing a preamplifier in a preceding stage of the quantizer, it is possible to improve the resolution to some extent. However, in order to convert a signal having an amplitude of ±1 millivolt, for example, into a 4-bit digital value using a comparator having an input variation of ±5 millivolts, a preamplifier having such a high gain as hundreds of times, for example, is to be used. As a result, a disadvantageous effect may arise such that the circuit operational speed is considerably reduced. Also, even if a high-gain preamplifier is used, it has a resolution limit due to its input-referred noise. Therefore, it is difficult to quantize such a small signal as one having the amplitude of 1 millivolt or less into multi-bit data.

In contrast thereto, in the ΔΣ modulator 10 according to the present embodiment, the input signal amplitude of the quantizer 16 is sufficiently great as mentioned above. Therefore, it is possible to implement multi-bit quantization. For example, when the output amplitude of the passive integrator 14 is ±12.5 millivolts, it is possible to implement 4-bit quantization by using a parallel-type A/D converter (having the quantization step width=25 millivolts/$2^4$=1.5625 millivolts) having the output varying among 16 levels from the input range of 25 millivolts, after amplifying by a 16-time preamplifier.

Further, in the ΔΣ modulator 10 according to the present embodiment, the plurality of stages of integrators include one stage of the passive integrator 14 that is an analog circuit and the digital integrator 20 as the other integrator. Therefore, according to the present embodiment, it is possible to reduce the number of analog circuits including integrators as much as possible. For example, by employing a fine CMOS process technology having a design rule of 0.6 μm or less, the occupied area and the power consumption of the digital integrator 20 are sufficiently smaller in comparison to an integrator made of an analog circuit. Therefore, according to the present embodiment, it is possible to simplify the whole circuit as the ΔΣ modulator, reduce the chip area and reduce the power consumption.

Figure 2:
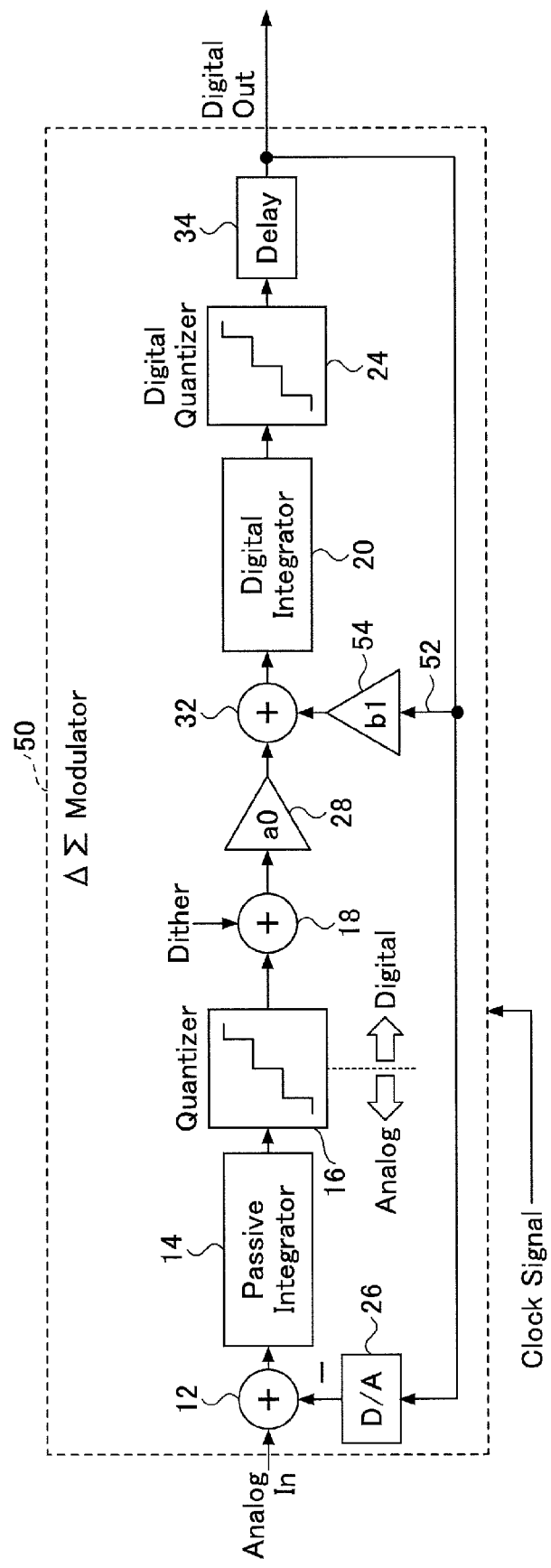
FIG. 2 shows a configuration diagram of a ΔΣ modulator to be compared with the ΔΣ modulator according to the present embodiment.

A ΔΣ modulator of a second order or more has two or more integrators and feedback. A 90° phase shift occurs in one stage of an integrator, and 180° phase shift occurs in two stages of integrators. Therefore, the whole system may be unstable, and an unexpected oscillation may occur. In order to suppress such an oscillation and ensure a stable operation, the following two methods (1) and (2) can be considered. That is, according to the method (1), a feedforward type ΔΣ modulator is configured where, as in the present embodiment, on the signal path from the input to the output, the bypass path 22 bypassing the digital integrator 20 is installed. According to the method (2), a feedback type ΔΣ modulator is configured where, instead of the bypass path 22, a feedback path is installed, as shown in FIG. 2, which returns the output digital value to the input of the digital integrator 20. Hereinafter, the ΔΣ modulator shown in FIG. 2 will be referred to as a ΔΣ modulator 50, and the feedback path will be referred to as the corresponding feedback path 52.

In the configuration of the ΔΣ modulator 10 or the ΔΣ modulator 50, the time average for a sufficiently long period of time of the input of the digital integrator 20 (i.e., the DC component thereof) is zero. This is because, if the DC component of the input of the digital integrator 20 were not zero, the DC component would be continuously added and integrated in the digital integrator 20, therefore the output of the integrator 20 would be out of scale in the positive or negative direction and thus, the operation could not be continued. In other words, in the ΔΣ modulator 10, feedback is carried out from the output to the input such that the time average of the input of the digital integrator 20 is zero, and the DC gain $H_{DI}$(DC) of the digital integrator 20 is infinite.

On the other hand, there is a case where the time average of the input of the passive integrator 14 for a sufficiently long period of time (i.e., the DC component thereof) is not zero. If the input DC component is not zero, the output of the passive integrator 14 is biased in the positive or negative direction. However, the passive integrator 14 has the integrator leak in proportion to the output. Therefore, the output is not out of scale, the output falls within a predetermined range, and thus, a stable operation is carried out. Thus, the passive integrator 14 has a finite DC gain $H_{PI}$(DC).

However, the integrator leak generated in the passive integrator 14 acts as an error in A/D conversion carried out by the A/D converter. Therefore, if the integrator leak is in proportion to the input or the output, a gain error occurs. Hereinafter, X denotes the analog input of the ΔΣ modulator 10 or 50; Y denotes the digital output thereof; and $H_{PI}$ (DC) denotes the DC gain of the passive integrator 14. Also, it will be assumed that the dither signal has no load (zero), the resolution of the quantizer is sufficiently high and the quantization error is ignorable.

In the ΔΣ modulator 50 shown in FIG. 2, the input of the digital integrator 20 is "(the output of passive integrator 14)× a0−(the output of ΔΣ modulator 50)×b1". Note that "b1" is a proportionality factor to be multiplied by a multiplier 54 installed on the feedback path 52 with the output of the ΔΣ modulator 50 and is used to calculate the value to be subtracted from the digital value acquired from multiplying the proportionality factor a0 by the multiplier 28. Because the input of the digital integrator 20 is zero, the following formula holds:

$$(X-Y) \times H_{PI}(DC) \times a0 - Y \times b1 = 0$$

$$\therefore Y = a0 \cdot H_{PI}(DC) \cdot X / (a0 \cdot H_{PI}(DC) + b1)$$

Accordingly, the feedback-type ΔΣ modulator 50 has the following DC gain G2:

$$G2=Y/X=1/(1+b1/(a0 \cdot H_{Pf}(DC)))$$

When the constants are set (for example, $a0 \cdot H_{Pf}(DC)=20$ and $b1=1$) in such a manner that $a0 \cdot H_{Pf}(DC) \gg 1$ and $b1 > 0$ hold, the above-mentioned DC gain G2 has a value less than "1". Thus, the feedback-type ΔΣ modulator 50 may have a gain error occurring due to the integrator leak. Also, when the gain of the quantizer 16 typified by the DC gain $H_{Pf}(DC)$ or the proportionality factor a0 of the passive integrator 14 varies due to a manufacturing process or a temperature variation, the DC gain G2 varies.

On the other hand, in the ΔΣ modulator 10 according to the present embodiment, the input of the digital integrator 20 is one acquired from multiplying the output of the passive integrator 14 with the proportionality factor a0. Because this input of the digital integrator 20 is zero, the following formula holds:

$$(X-Y) \times H_{Pf}(DC) \times a0 = 0$$

$$\therefore Y = X$$

Accordingly, the feedforward-type ΔΣ modulator 10 has the following DC gain G1:

$$G1 = Y/X = 1$$

Therefore, the feedforward-type ΔΣ modulator 10 has no gain error occurring due to the integrator leak. Also, because the DC gain G1 does not depend on the proportionality factors a0 and a1 and the DC gain $H_{Pf}(DC)$ of the passive integrator 14, the DC gain G1 itself does not vary even when a variation in a manufacturing process and/or a temperature variation occurs. Therefore, in the ΔΣ modulator 10 according to the present embodiment, it is possible to eliminate a gain error while suppressing an oscillation and ensuring a stable operation.

Also, as mentioned above, the DC component of the input of the digital integrator 20 is zero. Therefore, in the feedforward-type ΔΣ modulator 10, also, the DC component of the output of the quantizer 16 before being multiplied by the proportionality factor a0 is zero. Further, the DC component of the input of the quantizer 16 is zero provided that the quantization error is ignored. In other words, in the feedforward-type ΔΣ modulator 10, the input and the output of the quantizer 16 vary within a narrower range about the operation center value that is zero in comparison to the feedback-type ΔΣ modulator 50 having the operation center value of the input of the quantizer 16 varying depending on the analog input. Therefore, in the ΔΣ modulator 10 according to the present embodiment, it is possible to reduce the number of the comparators included in the quantizer 16 and miniaturize the circuit scale. Also, it is possible to improve the linearity of the quantizer 16 and improve the resolution of the whole ΔΣ modulator.

In a ΔΣ modulator, an idle tone phenomenon may occur where, when an analog quantity near a certain specific value is input, a low-frequency tone not included in the input signal is output. Also, in a ΔΣ modulator employing an integrator having the integrator leak such as the passive integrator 14, a dead zone (an unresponsive input range) phenomenon may occur where the output is maintained at a fixed value near a specific input value and does not vary. The dead zone phenomenon occurs due to the integrator leak balancing an input value when the input is near a certain specific value.

In order to suppress such an idle tone phenomenon and a dead zone phenomenon in a ΔΣ modulator, it is advantageous to apply a "dither" signal. For example, a dither application circuit as an analog circuit may be installed on the input side of the comparators of the quantizer 16, and a dither signal may be applied to the inputs of the comparators. A dither signal is to be applied to the input of the quantizer 16 with a suitable amplitude. When the amplitude of the dither signal is too small, the advantageous effect of the dither signal is not sufficiently acquired. On the other hand, when the amplitude of the dither signal is too great, the quantization error may be increased too much and the SNR may be degraded, or the output of the passive integrator 14 may greatly vary and exceed the operation input range of the quantizer 16 (that is, a signal overflow may occur), the quantizer 16 may operate not properly, and thus, the error of A/D conversion may be further increased.

In such a configuration, as the ΔΣ modulator 10 according to the present embodiment, that the output of a passive integrator is quantized by a quantizer, when the amplitude of the output of the passive integrator is less than or equal to approximately 10 millivolts and the resolution of the quantizer has a lower level such as less than or equal to approximately several millivolts, for example, the amplitude of the dither signal that is input to the inputs of the comparators of the quantizer has a very small level such as nearly several millivolts or less. However, in such a configuration, it is not easy to add a dither application circuit as an analog circuit to apply a dither signal having a very small amplitude to the input side of the comparators of the quantizer for generating and applying a dither signal having a precise amplitude not including a manufacturing variation.

In contrast thereto, in the ΔΣ modulator 10 according to the present embodiment, a circuit generating a dither signal is installed in a digital domain in a subsequent stage of the quantizer 16, and an adder 18 is installed in the subsequent stage of the quantizer 16 to apply the dither signal to the output of the quantizer 16. Thus, the dither signal "Dither" is applied to the output of the quantizer 16. The dither signal "Dither" is generated by a relatively simple digital circuit such as a square wave generation circuit periodically generating a square wave in a digital domain.

Therefore, in the ΔΣ modulator 10 according to the present embodiment, it is possible to stably generate and apply a highly precise dither signal "Dither", equivalently to a dither signal application configuration in an analog domain, without installing a high precision dither application circuit in an analog domain in a preceding stage of the quantizer 16, by installing a dither application circuit in a digital domain in a subsequent stage of the quantizer 16. Therefore, according to the present embodiment, it is possible to suppress an idle tone phenomenon and a dead zone phenomenon while simplifying a configuration for generating a dither signal.

Note that, as a result of a periodic waveform being used as a dither signal "Dither" as in the present embodiment, it is easy to remove the error component generated due to the dither signal "Dither" in the digital filter in the subsequent stage of the ΔΣ modulator 10 (for example, a notch filter having a zero characteristic at the frequency of the dither signal "Dither", a moving average filter, or so).

Further, it is also possible to combine the movement of the operating point through application of a dither signal "Dither" in a digital domain with the filter characteristic and the integrator leak of the passive integrator 14 to apply a dither signal "Dither" having an amplitude smaller than the quantization step width to the analog input of the quantizer 16.

Generally speaking, in a passive integrator, the output signal amplitude is considerably smaller. In a configuration where the output of a passive integrator is quantized by a quantizer, when the output amplitude has such a level not ignorable in comparison to the input-referred noise of the quantizer, the circuit noise of the quantizer functions as a dither signal. By setting the amplitude of the input-referred noise of the quantizer and the quantization step width of the quantizer to have suitable magnitudes and applying a dither signal having a suitable periodic waveform in a digital domain, the dead zone may be effectively dispersed by both the input-referred noise of the quantizer and the digital dither signal to be reduced to an ignorable level in comparison to the noise.

Specifically, where Viq (rms; root-mean-square) denotes the rms value of the input-referred noise of the quantizer and $\Delta q$ denotes the quantization step width of the quantizer, the following relational expressions hold. Further, by setting the amplitude Vdither of a digital dither signal in such a manner that the following relational expressions hold, the dead zone is almost extinguished.

$$2 \times Viq(rms) \leq \Delta q \leq 8 \times Viq(rms)$$

$$\tfrac{1}{2} \times \Delta q \leq Vdither \leq 2 \times \Delta q$$

Note that, by setting the quantization step width $\Delta q$ to be less than $2 \times Vig(rms)$, it is possible to almost extinguish the dead zone by the circuit noise of the quantizer without regard to whether to apply the digital dither signal "Dither". However, in this configuration, it is necessary to increase the number of the comparators in the quantizer in order to reduce the quantization step width $\Delta q$ for the same input voltage range, whereby the circuit scale is increased disadvantageously. Contrary, it is also possible to almost extinguish the dead zone by increasing the circuit noise of the quantizer in design. However, when the rms value Viq (rms) of the input-referred noise of the quantizer exceeds $\Delta q/2$, the input-referred noise exceeds the quantization error of the quantizer, whereby the SNR of the whole A/D converter is degraded disadvantageously.

In contrast thereto, in the $\Delta\Sigma$ modulator 10 according to the present embodiment, the rms value Viq (rms) of the input-referred noise of the quantizer 16 and the quantization step width $\Delta q$ are set according to the above-mentioned relational expressions. Therefore, according to the present embodiment, it is possible to effectively disperse and extinguish the dead zone without increasing the circuit scale and without remarkably degrading the SNR.

Below, with reference to FIGS. 3-6D, one example of a simulation of the A/D conversion characteristics through circuit modeling in a case where the dither signal "Dither" is applied under specific conditions of the $\Delta\Sigma$ modulator 10 according to the present embodiment will be shown.

Figure 3:
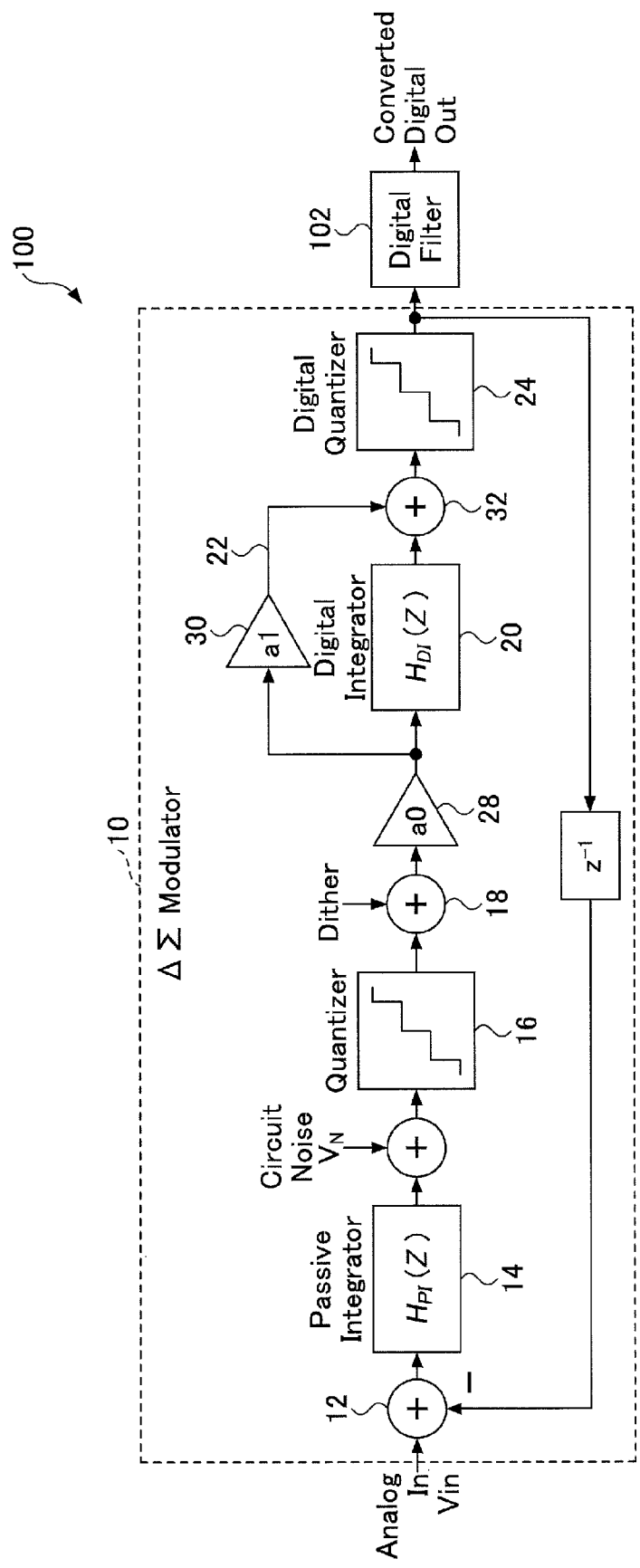
FIG. 3 shows a configuration diagram of a ΔΣ A/D converter to which the ΔΣ modulator according to the present embodiment is applied.
Figure 4:
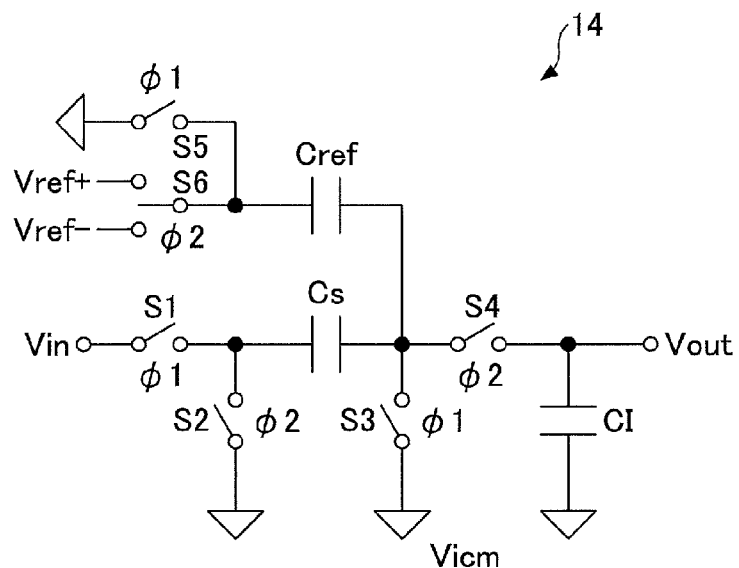
FIG. 4 shows a circuit diagram of a passive integrator included in the ΔΣ modulator according to the present embodiment.
Figure 5:
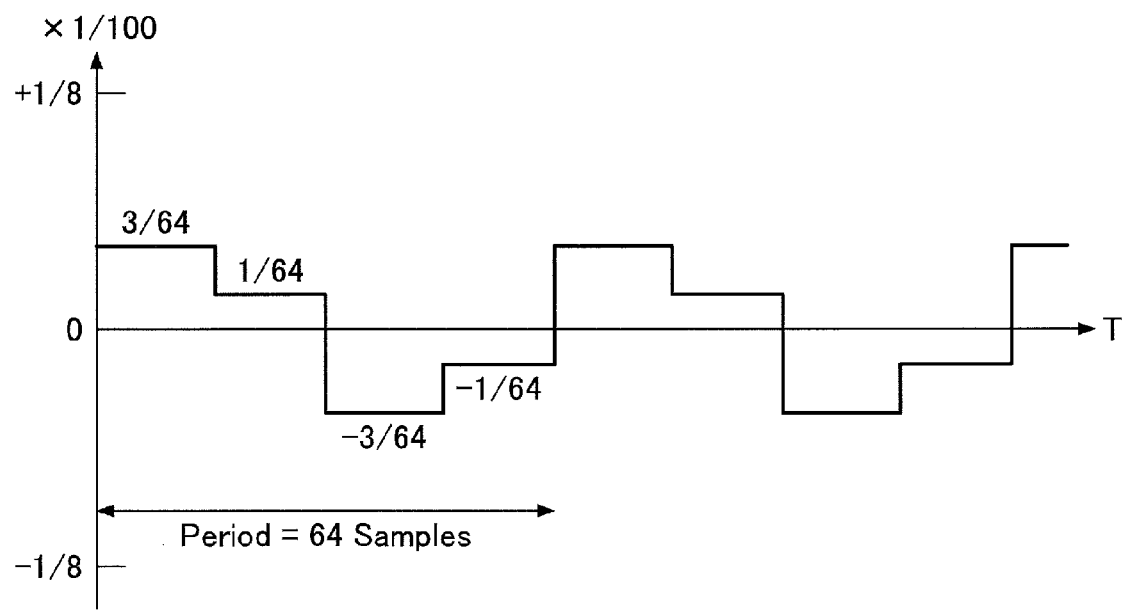
FIG. 5 illustrates a waveform expressing a dither signal "Dither" used in the ΔΣ modulator according to the present embodiment.

FIG. 3 shows a configuration diagram of a $\Delta\Sigma$ A/D converter 100 to which the $\Delta\Sigma$ modulator 10 according to the present embodiment is applied. FIG. 4 shows a circuit diagram of the passive integrator 14 included in the $\Delta\Sigma$ modulator 10 according to the present embodiment. FIG. 5 illustrates a waveform expressing the dither signal "Dither" used in the $\Delta\Sigma$ modulator 10 according to the present embodiment. FIGS. 6A-6D illustrates examples of input/output characteristics of A/D conversion as the simulation result.

The $\Delta\Sigma$ A/D converter 100 shown in FIG. 3 includes the $\Delta\Sigma$ modulator 10 and the digital filter 102. That is, the $\Delta\Sigma$ A/D converter 100 employs, as a $\Delta\Sigma$ modulator, the feedforward-type $\Delta\Sigma$ modulator 10 according to the present embodiment.

Note that, as a delay element, a delay circuit $z^{-1}$ is used placed on the feedback path to return the output of the digital quantizer 24 to the analog input side instead of the delay circuit 34 placed in the subsequent stage of the digital quantizer 24 as shown in FIG. 1. In the configuration of the $\Delta\Sigma$ modulator using the delay circuit $z^{-1}$, the circuit operations are the same as those of the $\delta$1 modulator using the delay circuit 34 except that the output sequence is output faster by one sample because the output sequence is not delayed. Also, an adder is additionally installed on the input side of the quantizer 16 to input the circuit noise $V_N$. Further, the $\Delta\Sigma$ modulator 10 is a discrete time system; the passive integrator 14 is an integration circuit of the discrete time system made by a switched capacitor (SC) circuit as an integrator having the integrator leak; and the transfer function $H_{PI}(z)$ is given by the following formula:

$$H_{PI}(z) = (\tfrac{1}{100}) \times (1/(1 - 0.95 \times z^{-1}))$$

The factor ($\tfrac{1}{100}$) in the right side of the above formula is a factor determined by the circuit configuration and the element constants of the passive integrator 14.

For example, as shown in FIG. 4, assuming that the passive integrator 14 has a sampling capacitor Cs, an integration capacitor CI, a reference electric potential sampling capacitor Cref and switches S1-S6, the above-mentioned factor ($\tfrac{1}{100}$) is determined by the ratio (Cs/Ctotal) between the capacitance value Cs of the sampling capacitor Cs and the total value Ctotal (=Cs+Cref+CI) of the capacitance values of the capacitors connected to the integration capacitor CI at a time of an integration process of the passive integrator 14.

In this passive integrator 14, an input terminal to which an analog input electric potential Vin as a target of A/D conversion is input is connected to the input-side terminal of the sampling capacitor Cs via the switch S1, and also, a reference terminal to which a reference electric potential is input is connected to the input-side terminal of the sampling capacitor Cs via the switch S2. Also, a reference terminal to which an input common mode electric potential Vicm is input is connected to the output-side terminal of the sampling capacitor Cs via the switch S3, and also, an output terminal from which the output electric potential Vout of the passive integrator 14 is output is connected to the output-side terminal of the sampling capacitor Cs via the switch S4. Further, one end of the integration capacitor CI is connected to the output-side terminal of the sampling capacitor Cs via the switch S4, the other end of which is connected to a reference terminal. Furthermore, one end of the reference electric potential sampling capacitor Cref is connected to the output-side terminal of the sampling capacitor Cs. The other end of the reference electric potential sampling capacitor Cref is connected to a reference terminal via the switch S5. Also, a reference terminal to which a reference electric potential Vref+ is input or a reference terminal to which a reference electric potential Vref− is input is connected to the other end of the reference electric potential sampling capacitor Cref via the switch S6.

The switches S1, S3 and S5 are respectively turned off when the analog input electric potential Vin that is input to the input terminal is not to be sampled by the sampling capacitor Cs. On the other hand, the switches S1, S3 and S5 are respectively turned on when the analog input electric potential Vin is to be sampled by the sampling capacitor Cs (a sampling phase $\phi$1). The switches S2, S4 and S6 are respectively turned on or off in the mode inverted from the switches S1, S3 and S5. Specifically, the switches S2, S4 and S6 are respectively turned off when the charge stored in the sampling capacitor Cs is not to be transferred to the integration capacitor CI to be added and integrated. On the other hand, the switches S2, S4 and S6 are respectively turned on when the charge stored in the sampling capacitor Cs is to be transferred to the integration capacitor CI to be added and integrated (an integration phase φ2).

The sampling capacitor Cs is capable of storing the input charge according to the analog input electric potential Vin that is input via the switch S1, and samples the analog input electric potential Vin by storing the input charge. The integration capacitor CI is capable of storing the charge transferred from the sampling capacitor Cs, and adds and integrates the charge by storing the charge transferred from the sampling capacitor Cs.

Further, in the ΔΣ A/D converter shown in FIG. 3, the digital integrator 20 is an integrator with a delay without the integrator leak. The transfer function $H_{DI}(z)$ thereof is expressed by the following formula. Further, the proportionality factor a0 of the multiplier 28 is "100" and the proportionality factor a1 of the multiplier 30 is "2".

$$H_{DI}(z)=Z^{-1}/(1-Z^{-1})$$

Circuit design values used in the simulation will now be shown. Note that the circuit design values will be expressed in setting values normalized by the reference electric potential Vref. Further, in the brackets, the voltage-converted values of the circuit design values for a case where a setting is made as Vref=5 volts are shown.

The quantization step width Δq of the quantizer 16 is (1/100)×(1/32) (=1.5625 millivolts), and the output range thereof is −(1/100)×(1/4) through +(1/100)×(1/4) (=−12.5 millivolts through +12.5 millivolts). The quantization step width of the digital quantizer 24 is 1/8 (=625 millivolts), and the output range thereof is −1 through +1 (=−5 volts through +5 volts). As shown in FIG. 5, the digital dither signal has the four values (±(1/100)×(3/64) and ±(1/100)×(1/64)) (=±2.34375 millivolts and ±0.78125 millivolts) that are repeated periodically, and has a periodic waveform like a square wave where the number of samples per period is "64".

Further, the circuit noise $V_N$ that is applied to the input side of the quantizer 16 is a white noise having the rms value of (1/100)×(1/160) (=approximately 0.3 millivolts(rms)). The analog input signal Vin varies in the range of −0.005 through +0.005 (=−25 millivolts through +25 millivolts) with the slope of 1×10$^{-7}$/sample. As the digital filter 102 in the subsequent stage of the ΔΣ modulator 10, one including 3 stages of moving average filters connected in a cascade manner each calculating a moving average of 64 samples is used.

Figure 6A:
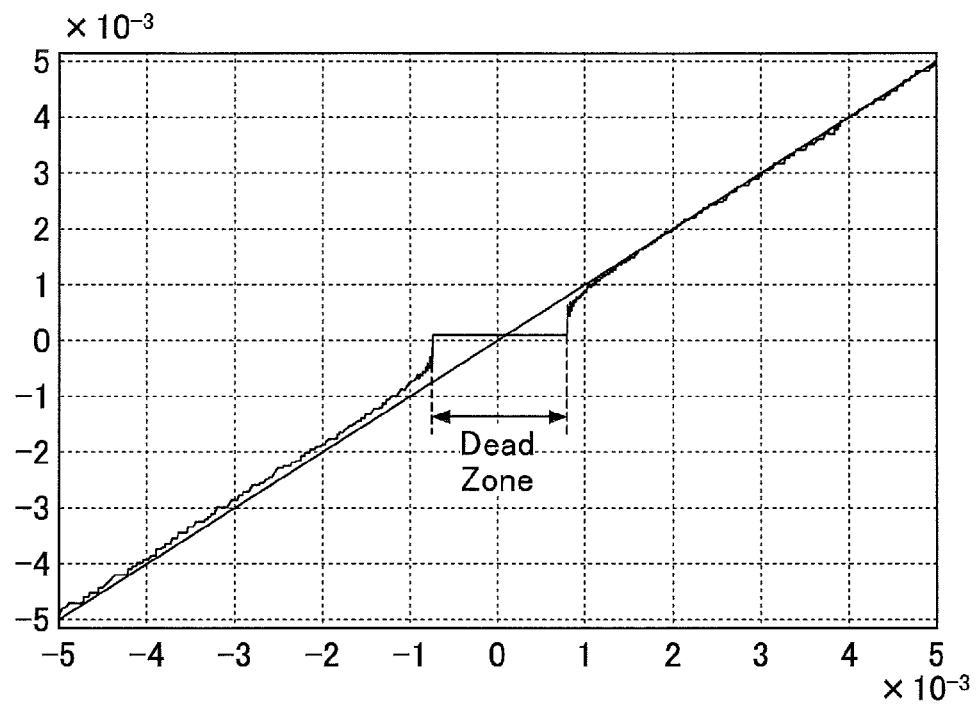
FIGS. 6A-6D illustrate examples of input/output characteristics of A/D conversion as simulation results.
Figure 6B:
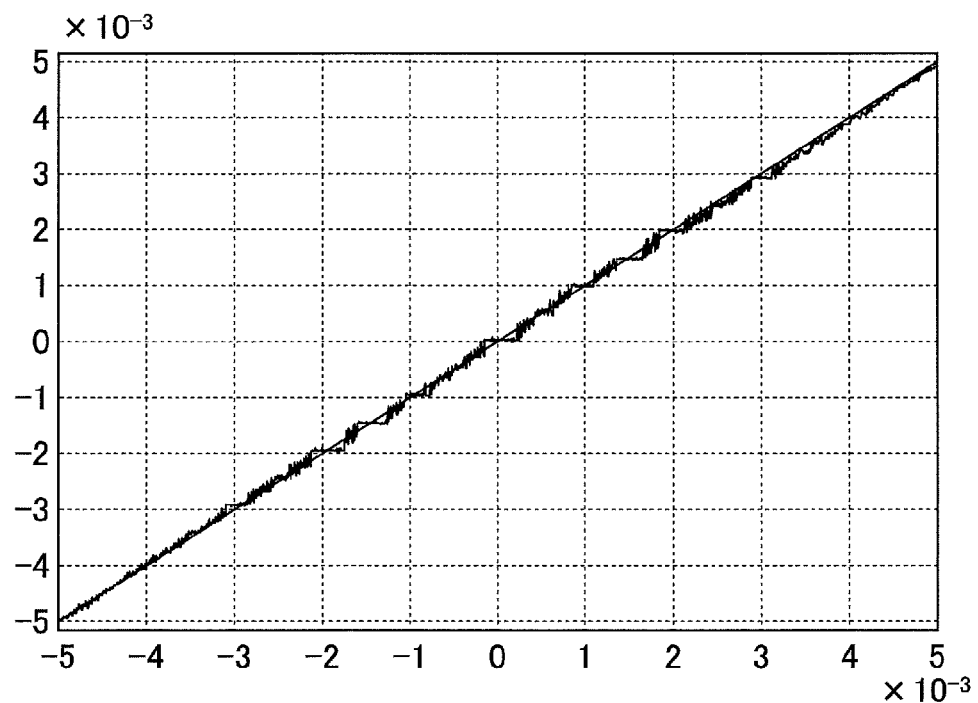
Figure 6C:
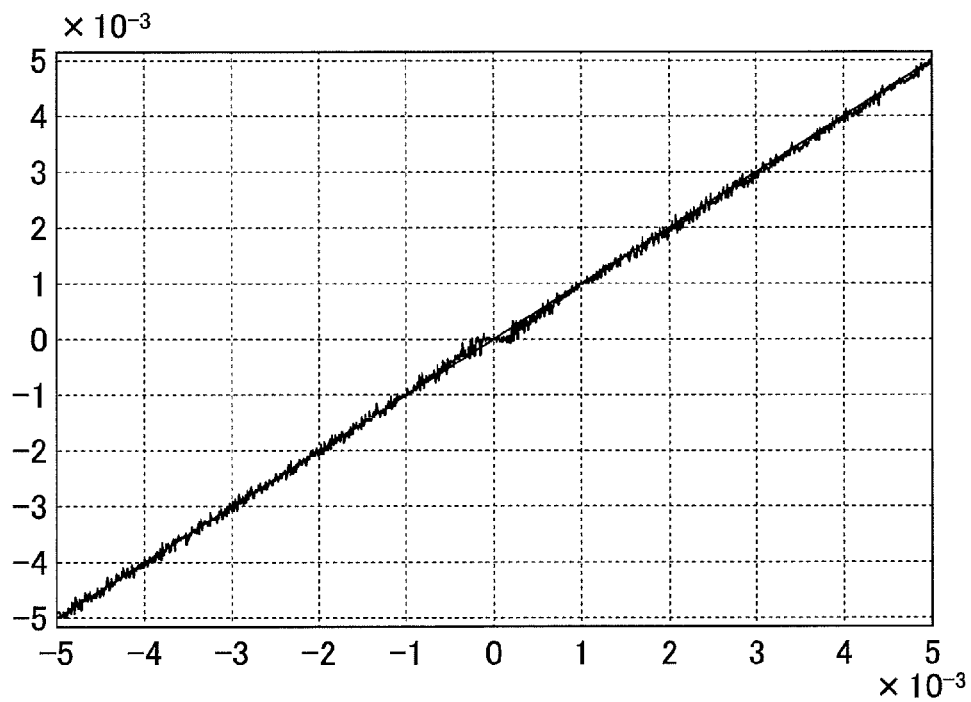
Figure 6D:
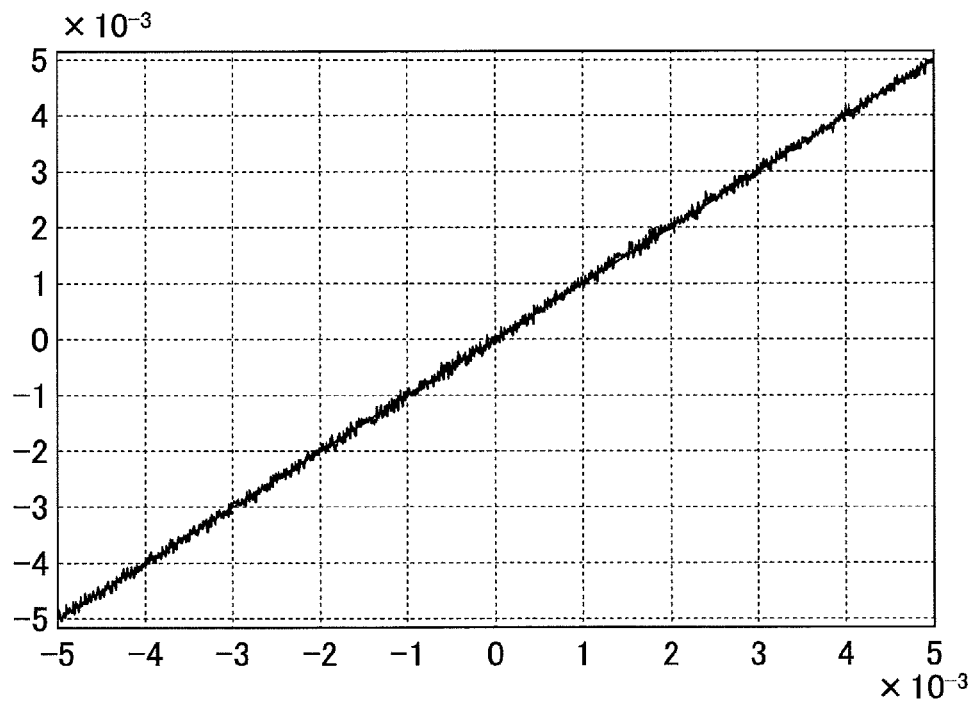

As a result of a simulation being carried out on the ΔΣ A/D converter 100 shown in FIG. 3 according to the above-mentioned circuit model, the input/output characteristics of A/D conversion such as those shown in FIGS. 6A-6D are acquired. Note that FIG. 6A shows a case where the circuit noise $V_N$ is not applied to the input side of the quantizer 16 and the digital dither signal "Dither" is not applied (simulation A); FIG. 6B shows a case where the circuit noise $V_N$ is not applied to the input side of the quantizer 16 and the digital dither signal "Dither" is applied (simulation B); FIG. 6C shows a case where the circuit noise $V_N$ is applied to the input side of the quantizer 16 and the digital dither signal "Dither" is not applied (simulation C); and FIG. 6D shows a case where the circuit noise $V_N$ is applied to the input side of the quantizer 16 and the digital dither signal "Dither" is applied (simulation D). Also, in the graphs shown in FIGS. 6A-6D, in addition to the waveforms as the input/output characteristics of the above-mentioned simulation results, waveforms of input/output characteristics are shown for reference in a case where a filter process by the above-mentioned digital filter 102 is carried out on the analog input electric potential Vin.

In simulation A, it can be seen that the dead zone is generated with the width of ±0.0008 (=±4 millivolts). In simulation B, it can be seen that the dead zone is dispersed and reduced in comparison to that of simulation A. However, it can be seen that the dead zone is still not extinguished in simulation B. In simulation C, it can be seen that the dead zone is recued in comparison to that of simulation A but the dead zone is generated with the width of ±0.0002 (=±1 millivolt). In contrast thereto, in simulation D, it can be seen that the dead zone is hardly generated.

Thus, it can be seen that, in the ΔΣ modulator 10, it is possible to disperse and extinguish the dead zone without increasing the circuit scale and without remarkably degrading the SNR by appropriately designing the input-referred noise and the quantization step width of the quantizer 16 and appropriately designing the digital dither signal to be applied.

Figure 7:
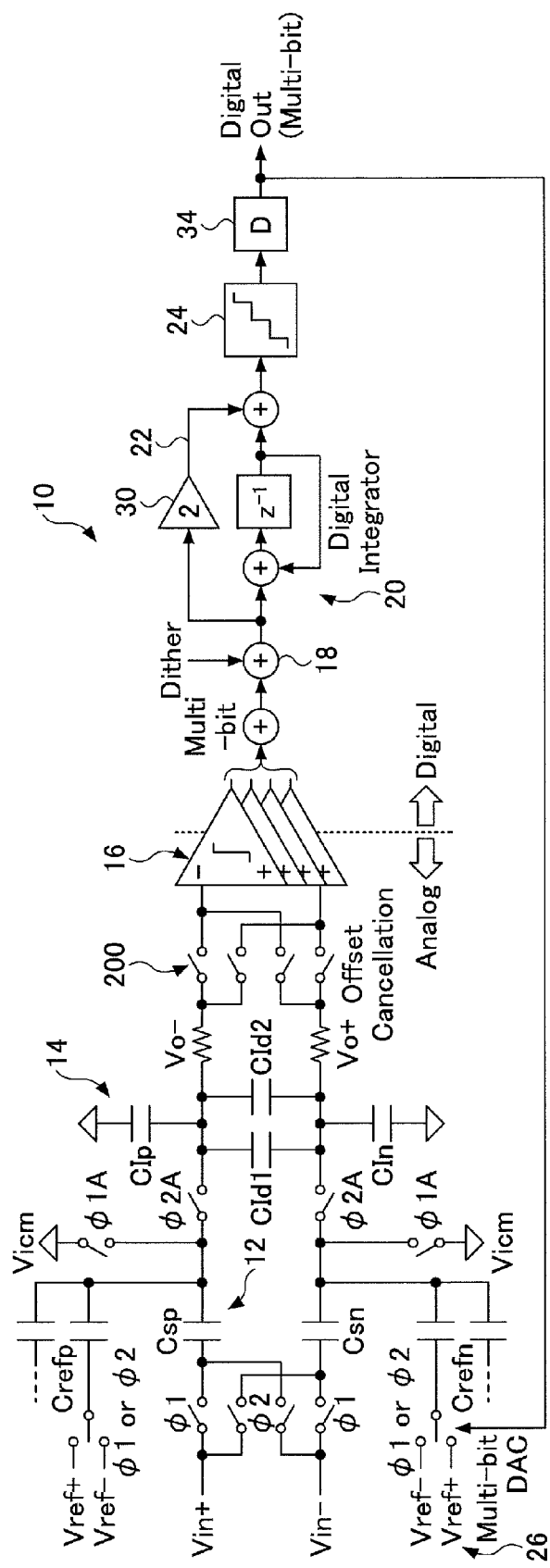
FIG. 7 shows a typical circuit diagram of the ΔΣ modulator according to the present embodiment.

FIG. 7 shows a typical circuit diagram of the ΔΣ modulator 10 according to the present embodiment. The ΔΣ modulator 10 according to the present embodiment is a feedforward-type ΔΣ modulator, and can be configured to include a fully differential circuit as shown in FIG. 7. As shown in FIG. 7, in the ΔΣ modulator 10, the passive integrator 14 is an integrator circuit of a discrete time system employing an SC circuit configured to include capacitors and switches. However, it is also possible that the passive integrator 14 does not employ such an SC circuit of a discrete system but employs an integration circuit of a continuous time system (for example, an RC circuit configured to include a resistor and a capacitor, or so).

The integration capacitors included in the passive integrator 14 include both against-common-mode capacitors CIp and CIn and inter-differential-output (Vo+ and Vo−) capacitors CId1 and CId2, and thus, the capacitance is increased. In semiconductor integrated circuits (ICs), a capacitor having a larger capacitance requires a wider chip area. However, the inter-differential-output capacitors CId1 and CId2 have such an advantage in comparison to the against-common-mode capacitors CIp and CIn that the capacitance values appear to be doubled. Therefore, in the above-mentioned configuration, it is possible to provide the large-capacitance integration capacitors CId1, CId2, CIp and CIn with the improved area efficiency. Thus, it is possible to implement the reduced-size passive integrator 14 with the reduced integrator leak.

Note that it is common that a capacitor in an IC has an asymmetric structure between the two terminals. Therefore, an amount of a parasitic capacitance attached is different between the top electrode and the bottom electrode. Therefore, in order to improve the symmetry between the electrodes of the integration capacitors, it is advantageous that the two inter-differential-output capacitors CId1 and CId2 are connected in parallel while the polarity is inverted therebetween. In this configuration, it is possible to improve the symmetry of the electrodes by balancing the respective parasitic capacitances of the electrodes.

Further, as shown in FIG. 7, it is possible to install an offset canceling circuit 200 inverting the inputs of the quantizer 16 periodically in a preceding stage of the quantizer 16. When the inputs are inverted, the charge remaining in the input parasitic capacitance of the quantizer 16 may flow into the integration capacitors CId1, CId2, CIp and CIn, and an error may occur in the integrator. Therefore, in order to suppress the remaining charge flowing into the integration capacitors CId1, CId2, CIp and CIn, it is possible to install discharge switches at the input side of the quantizer 16 to discharge the remaining charge. Instead of installing the discharge switches, it is also possible that the remaining charge at the input side of the quantizer 16 is discharged through temporally overlapping the turned-on states of the input inversion switches.

Further, as shown in FIG. 7, it is possible to insert resistors between the integration capacitors CId1, CId2, CIp and CIn of the passive integrator 14 and the input side of the quantizer 16. As a result of a thermal noise being generated from the inserted resistors, the circuit noise to the input side of the quantizer 16 increases. However, if the noise is a random noise and has an appropriate amplitude, there is a possibility that the noise effectively functions as a dither signal. By inserting these resistors between the integration capacitors CId1, CId2, CIp and CIn of the passive integrator 14 and the input inversion switches of the offset cancellation circuit 200, it is possible to prevent the charge from leaking from the integration capacitors CId1, CId2, CIp and CIn via the input inversion switches when the inputs of the quantizer 16 are inverted for offset cancellation. Thus, it is possible to allow these resistors to function as current limiting resistors.

Further, as shown in FIG. 7, as the D/A converter 26, it is possible to employ a multi-bit D/A converter using a plurality of capacitor pairs Crefp and Crefn sampling reference electric potentials Vref (=(Vref+)−(Vref−)). Note that it is also possible to apply a mismatch cancellation technique such as Dynamic Element Matching (DEM) to this switching operation of the capacitors Crefp and Crefn. Further, it is also possible to sample a certain initial value in a sampling phase φ1 and output a D/A conversion result in an integration phase φ2. It is also possible to apply a mismatch cancellation technique such as DEM to both a timing of the sampling phase φ1 and a timing of the integration phase φ2.

Further, as shown in FIG. 7, as the quantizer 16, it is possible to use a parallel-type A/D converter including a plurality of comparators having different thresholds used in parallel (a multi-bit quantizer). Note that it is also possible to place a preamplifier in a preceding stage of the quantizer 16.

Further, as shown in FIG. 7, as the digital integrator 20, it is possible to use an integrator with a delay.

Thus, the ΔΣ modulator has been described in the present embodiment. However, the present invention is not limited to the present embodiment. Various modifications and improvements such as combinations or replacements with parts or all of another embodiment(s) can be made without departing from the scope of the present invention.

For example, in the above-described embodiment, the ΔΣ modulator 10 is a second-order ΔΣ modulator having the single stage of the passive integrator 14 and the single stage of the digital integrator 20. However, the present invention is not limited thereto. It is also possible to apply the present invention to a ΔΣ modulator of third order or more having two or more digital integrators 20 connected in a cascade manner.

Also, in the above-mentioned embodiment, no other analog integrator is installed in a subsequent stage of the passive integrator 14. However, the present invention is not limited thereto. It is also possible to install an analog integrator such as a Low-Pass Filter (LPF) in a subsequent stage of the passive integrator 14.

Further, in the above-mentioned embodiment, no other integrator is installed in a preceding stage of the passive integrator 14. However, the present invention is not limited thereto. It is also possible to place an integrator such as an active integrator employing an operational amplifier, for example, in a preceding stage of the passive integrator 14.

Further, in the above-mentioned embodiment, the digital quantizer 24 is used to quantize the digital output value of the digital integrator 20. However, the present invention is not limited thereto. It is also possible to carry out ΔΣ modulation on the digital output value of the digital integrator 20 in the digital domain and output the value acquired from the ΔΣ modulation.

Note that in the above-mentioned embodiment, the passive integrator 14 is one example of an "integrator", the bypass path 22 is one example of a "feedforward path", and the adder 18 is one example of a "dither signal application part".

Thus, according to the present embodiment of the present invention, it is possible to ensure high resolution by suppressing an error occurrence due to a charge leak in an integrator while ensuing a high operational frequency.

The present application is based on and claims the benefit of priority of Japanese Priority Application No. 2014-239037, filed on Nov. 26, 2014, the entire contents of which are hereby incorporated herein by reference.

What is claimed is:

1. A ΔΣ modulator converting an input analog quantity into a digital value quantized with a predetermined number of bits and outputting the digital value, the ΔΣ modulator comprising:
an integrator that includes an integration capacitor and integrates a difference between the input analog quantity and an analog quantity acquired from D/A conversion of the output digital value by a D/A converter, an end of the integration capacitor from which charge that is input from the integrator's input terminal is stored being used as the integrator's output terminal;
a quantizer that quantizes an analog quantity acquired from integration by the integrator; and
a digital integrator that carries out an integration operation on data acquired from quantization by the quantizer.

2. The ΔΣ modulator as claimed in claim 1, further comprising:
a feedforward path provided on a signal path from an input side to an output side of the ΔΣ modulator, the feedforward path bypassing the digital integrator.

3. The ΔΣ modulator as claimed in claim 1, further comprising:
a feedback path that returns the output digital value to an input side of the digital integrator.

4. The ΔΣ modulator as claimed in claim 1, further comprising:
a dither signal application part that applies a dither signal to data acquired from quantization by the quantizer, the dither signal having a periodically repeated digital value of binary or more and having an amplitude greater than or equal to ½ a quantization step width of the quantizer.

5. The ΔΣ modulator as claimed in claim 2, further comprising:
a dither signal application part that applies a dither signal to data acquired from quantization by the quantizer, the dither signal having a periodically repeated digital value of binary or more and having an amplitude greater than or equal to ½ a quantization step width of the quantizer.

6. The ΔΣ modulator as claimed in claim 3, further comprising:
a dither signal application part that applies a dither signal to data acquired from quantization by the quantizer, the dither signal having a periodically repeated digital value of binary or more and having an amplitude greater than or equal to ½ a quantization step width of the quantizer.

7. The ΔΣ modulator as claimed in claim 4, wherein
the quantization step width is set to be greater than or equal to two times and less than or equal to eight times a root-mean-square value of an input-referred noise of the quantizer.

8. The ΔΣ modulator as claimed in claim 5, wherein
the quantization step width is set to be greater than or equal to two times and less than or equal to eight times a root-mean-square value of an input-referred noise of the quantizer.

9. The ΔΣ modulator as claimed in claim 6, wherein
the quantization step width is set to be greater than or equal to two times and less than or equal to eight times a root-mean-square value of an input-referred noise of the quantizer.

10. The ΔΣ modulator as claimed in claim 1, wherein
the quantizer, the digital integrator and the D/A converter operate in synchronization with each other by the same clock signal.

11. The ΔΣ modulator as claimed in claim 2, wherein
the quantizer, the digital integrator and the D/A converter operate in synchronization with each other by the same clock signal.

12. The ΔΣ modulator as claimed in claim 3, wherein
the quantizer, the digital integrator and the D/A converter operate in synchronization with each other by the same clock signal.

13. The ΔΣ modulator as claimed in claim 4, wherein
the quantizer, the digital integrator and the D/A converter operate in synchronization with each other by the same clock signal.

14. The ΔΣ modulator as claimed in claim 5, wherein
the quantizer, the digital integrator and the D/A converter operate in synchronization with each other by the same clock signal.

15. The ΔΣ modulator as claimed in claim 6, wherein
the quantizer, the digital integrator and the D/A converter operate in synchronization with each other by the same clock signal.

16. The ΔΣ modulator as claimed in claim 7, wherein
the quantizer, the digital integrator and the D/A converter operate in synchronization with each other by the same clock signal.

17. The ΔΣ modulator as claimed in claim 8, wherein
the quantizer, the digital integrator and the D/A converter operate in synchronization with each other by the same clock signal.

18. The ΔΣ modulator as claimed in claim 9, wherein
the quantizer, the digital integrator and the D/A converter operate in synchronization with each other by the same clock signal.

19. The ΔΣ modulator as claimed in claim 1, wherein
the digital integrator is such that two or more of the digital integrators are connected in a cascade manner.

20. The ΔΣ modulator as claimed in claim 2, wherein
the digital integrator is such that two or more of the digital integrators are connected in a cascade manner.

* * * * *